United States Patent [19]

Kalter et al.

[11] Patent Number: 5,972,745
[45] Date of Patent: Oct. 26, 1999

[54] METHOD OR FORMING SELF-ALIGNED HALO-ISOLATED WELLS

[75] Inventors: Howard L. Kalter, Colchester; Edward J. Nowak; Xiaowei Tian, both of Essex; Minh H. Tong; William R. Tonti, both of Essex Junction, all of Vt.

[73] Assignee: International Business Machines Corporation, Armonk, N.Y.

[21] Appl. No.: 08/866,674

[22] Filed: May 30, 1997

[51] Int. Cl.[6] .............................................. H01L 21/8238
[52] U.S. Cl. .......................... 438/220; 438/525; 438/527; 438/224; 438/228; 365/182
[58] Field of Search ..................................... 438/218, 219, 438/220, 221, 222, 223, 224, 225, 226, 227, 228, 294, 527, 525

[56] References Cited

U.S. PATENT DOCUMENTS

| | | |
|---|---|---|
| 3,921,283 | 11/1975 | Shappir . |
| 3,925,120 | 12/1975 | Saida et al. . |
| 4,907,058 | 3/1990 | Sakai . |
| 4,928,159 | 5/1990 | Mihara et al. . |
| 5,262,345 | 11/1993 | Nasser et al. . |
| 5,376,566 | 12/1994 | Gonzalez . |
| 5,409,848 | 4/1995 | Han et al. . |
| 5,426,063 | 6/1995 | Kaneko et al. . |
| 5,438,542 | 8/1995 | Atsumi et al. . |
| 5,439,835 | 8/1995 | Gonzalez . |
| 5,473,183 | 12/1995 | Yonemoto . |
| 5,500,379 | 3/1996 | Odake et al. . |
| 5,501,993 | 3/1996 | Borland . |
| 5,518,941 | 5/1996 | Lin et al. . |
| 5,534,449 | 7/1996 | Dennison et al. . |
| 5,578,509 | 11/1996 | Fujita . |
| 5,770,963 | 6/1998 | Akaogi et al. . |
| 5,831,313 | 8/1996 | Han et al. . |
| 5,875,129 | 11/1996 | Atsumi et al. . |

FOREIGN PATENT DOCUMENTS 6-338617  12/1994  Japan .

OTHER PUBLICATIONS

Atsumi et al, "a 16Mb flash EEPROM with a new self–data–refresh scheme for a sector erase operation," IEEE Journal of Solid–State Circuits vol. 29, No. 4, pp. 461–469, Apr. 1994.

Umezawa et al, "A 5–V–only operation 0.6 micron flash EEPROM with Row decoder scheme in triple–well structure," IEEE Journal of Solid–State Cicuits, vol. 27, No. 11 pp. 1540–1546, Nov. 1992.

*Primary Examiner*—John F. Niebling
*Assistant Examiner*—Jonathan Hack
*Attorney, Agent, or Firm*—Schmeiser, Olsen & Watts; Eugene I. Shkurko

[57] ABSTRACT

A method of forming a self-aligned halo-isolated well with a single mask is disclosed. First, a layer of resist is disposed over at least a portion of a substrate's surface. Then, an impurity of a first polarity type is implanted at an angle into the substrate through a gap in the layer of resist, thus forming a well having the impurity of the first polarity, which extends beneath the layer of resist. An impurity of a second polarity type is also implanted, using the same mask as previously used. The second implantation forms a well of the impurity of the second polarity disposed within the well of to impurity of the first polarity.

19 Claims, 1 Drawing Sheet

5,972,745

METHOD OR FORMING SELF-ALIGNED HALO-ISOLATED WELLS

BACKGROUND OF THE INVENTION

1. Technical Field

The invention relates generally to semiconductor devices, and more specifically, to methods for isolating field effect transistors semiconductor devices.

2. Background Art

In the formation of large scale integrated circuits using field effect transistors (FET), isolation between devices is of critical importance. For example, in complementary semiconductor device (CMOS) technology all the transistors on the same die traditionally share a common substrate (body) voltage when not isolated. Thus, when the threshold voltage of one FET (e.g., used for logic or memory integrated circuits) is increased, the threshold voltages of all the FETs on the die will also increase. This increase of threshold voltages not only impedes the performance of the logic and memory integrated circuits, but also decreases the switching margin of the overall circuit.

Hence, several methods have been developed to isolate individual devices. One method consists of using independent wells in forming each FET. Although this method successfully isolates each device, extra space is required in constructing a circuit, which makes it difficult to increase the packing density of CMOS and could result in a rather expensive circuit design. Another solution for isolating devices consists of the process of creating a trench at the boundary between two wells of different polarities (i.e., between a p-well region and an n-well region) so that the depth of the trench is greater than the depth of the wells. Unfortunately, it is difficult and may be costly to form a deep trench in a semiconductor substrate, and if formed, may cause defects such as crystal defects in the substrate and/or wells.

One solution that addresses the aforementioned problems is the formation of a well-within-a-well, or double well structure. Examples of these types of wells are found in the following U.S. Patents, which are herein incorporated by reference: U.S. Pat. No. 4,907,058, "Complementary Semiconductor Device Having a Double Well", issued March 1990 to Sakai; U.S. Pat. No. 5,262,345, "Complimentary Bipolar/CMOS Fabrication Method", issued November 1993 to Nasser et al.; and U.S. Pat. No. 5,473,183, "Semiconductor Device of a First Conductivity Type which has a First Well of a Second Conductivity Type Formed Therein and a Second Well of the First Conductivity Type Formed in the First Well and a Pair of MOSFET Formed in the First and Second Wells", issued December 1995 to Yonemoto. As discussed in these patents, the outer well of the double well structure provides the isolation to the inner well, allowing for compactibility and reliability of the circuit.

Unfortunately, although the aforementioned patents discuss a double well structure, the process of making these structures as described requires extra masks and extra masking steps. Not only does an extra mask take extra time and expense, but an extra mask makes it difficult, if impossible to align the two wells without any excess space between the wells, ultimately decreasing the performance of the circuit.

SUMMARY OF THE INVENTION

It is thus an advantage of the present invention to provide a method for forming a double well structure using a single mask.

It is a further advantage of the present invention to provide a method for forming a double well structure that is self-aligned, hence, eliminating extra space between wells.

The foregoing and other advantages of the invention are realized by a method of creating a halo-isolated well (i.e., a double well structure) with a single mask. First, a layer of resist is disposed over at least a portion of a substrate's surface. Then, an impurity of a first polarity type is implanted at an angle into the substrate through a gap in the layer of resist, thus forming a well having the impurity of the first polarity, which extends beneath the layer of resist. Third, an impurity of a second polarity type is implanted, using the same mask as previously used in the step of implanting at an angle. The implantation forms a well of the impurity of the second polarity disposed entirely within the well of the impurity of the first polarity. Thus, the well of the impurity of the first polarity type isolates the well of the impurity of the second polarity from the substrate, which may also be made up of the second polarity type.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements; and.

DETAILED DESCRIPTION OF THE DRAWINGS

Figure 1:
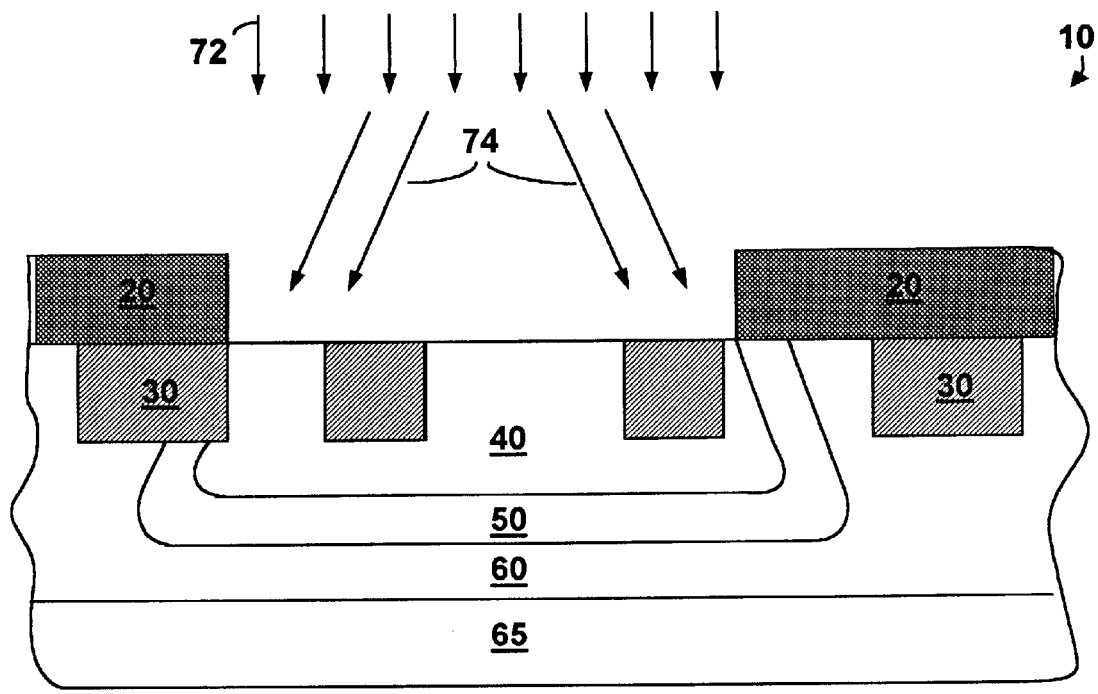
FIG. 1 is a schematic cross-sectional view illustrating a method of producing a halo-isolated well in accordance with an embodiment of the present invention.

Referring to FIG. 1, a sectional view of a halo-isolated well 10 and method thereof in accordance with the present invention is disclosed. The halo-isolated well 10 comprises a resist 20, shallow isolation 30 (e.g., shallow trench isolation or STI), a first well 50 comprising an impurity of a first polarity type, a second well 40 comprising an impurity of a second polarity type, and a substrate 60 and 65. The method of forming the halo-isolated well is done with a single mask. First, a layer of resist 20 is disposed over at least a portion of a substrate's 60 surface. Then, an impurity of a first polarity type is implanted at an angle 74 into the substrate 60 through a gap in the layer of resist 20, thus forming the first well 50 having the impurity of the first polarity type, which extends beneath the layer of resist 20. Third, an impurity of a second polarity type is implanted 72, using the same mask as previously used in the angled implantation 74. The implantation 72 forms a second well 40 of the impurity of the second polarity disposed entirely within the first well 50. The angled implantation 74 and implantation 72 may also be performed at the same time, thus increasing the production level of the integrated circuits having double-wells. Thus, the first well 50 isolates the second well 40 from the substrate 60, which may also be made up of the second polarity type.

The first well 50 is formed through the various angles and rotations of the angled implantation 74, examples of the angle being approximately between 30–60 degrees from normal to the substrate rotating between four to eight times in several directions. Although these and other specific values are and will be disclosed for exemplary purposes, other appropriate values may also be used that produce similar results in forming the halo-isolated wells of the present invention, and thus the invention is not limited to the exemplary values disclosed. The energy level and dosage of impurities also assist in the placement, polarity type, and depth of each well. Examples of these values include energy levels between 100 Kev to 200 Kev for the first well 50 and between 20 Kev to 200 Kev for the second well 40; and dosages of approximately $2 \times 10^{13}$ (2E13) cm$^2$ for the first well 50 and between approximately $1 \times 10^{11}$ (1E11) cm$^2$ to $1 \times 10^{13}$ (1E13) cm$^2$ for the second well 40. As aforementioned, these specific values are for exemplary purposes only and the invention is thereby not limited to such. Thus, the first well is self-aligned through the angled implantation and having a greater energy level than the second well. The self-alignment of the wells allows the wells to be adjoined without any extra space in between, hence improving the performance of the overall system.

Figure 2:
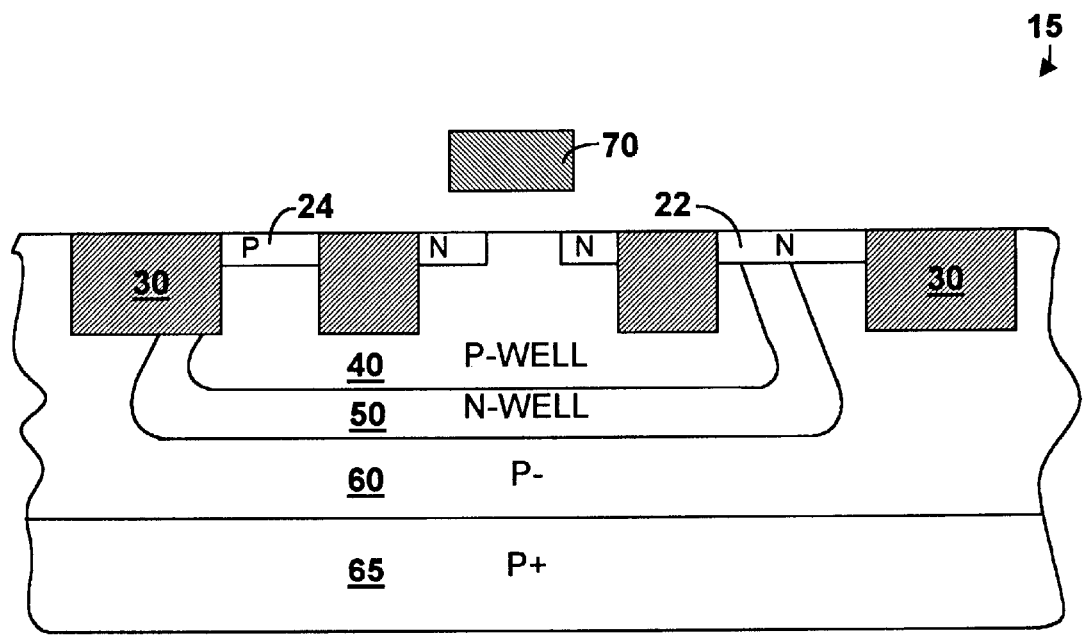
FIG. 2 is a sectional view of an exemplary MOSFET formed in accordance to the method as shown in FIG. 1.

As seen in FIG. 2, an exemplary n-type MOSFET 15 in a p-substrate CMOS process is formed in accordance to the method as disclosed in reference to FIG. 1. In this example, a halo-isolated p-well in a p-substrate is disclosed, but an n-well in an n-substrate may also be used to form a p-type MOSFET. The MOSFET 15 comprises a p-well contact 24, an n-well contact 22, a gate electrode 70, isolation 30, p-well 40, n-well 50, and substrate p–60 and p+65. As aforementioned, the n-well 50 is formed by adding an n-type implant (e.g., phosphorus) while the p-well mask is still in place. This implant completely isolates the p-well 40 from the p-substrate 60 by forming a narrow n-doped region (halo) 50 around the entire perimeter of the p-well. This n-well 50 can be contacted by using the typical masks to form an n+region 22 that intersects the n-well. The n-well may also be left floating if higher density is desired. Thus, a transistor, such as an n-type MOSFET, may be formed within the second well, or in this case, the p-well.

Thus, this invention provides a method for forming a halo-isolated well that uses a single mask, and is self-aligned, eliminating any extra space between the wells, improving the overall performance of the circuit. Furthermore, a cost-effective means is provided which benefits circuits such as a three-device-cell dynamic random access memory (DRAM) or similar logic that may require a late turn-on characteristic as compared to a support driver.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method comprising the steps of:
    a) disposing a layer of resist over at least a portion of a surface of a substrate;
    b) implanting at an angle into the substrate through a gap in said layer of resist an impurity of a first polarity type, said implanting and said angle sufficient to form a first well of said impurity of the first polarity type extending beneath said layer of resist; and
    c) implanting an impurity of a second polarity type, using the same mask as used in the step of implanting at an angle, to form a second well of said impurity of the second polarity type disposed entirely within said first well.

2. The method of claim 1, further comprising the step of:
    d) forming a transistor entirely within said second well.

3. The method of claim 1, wherein said substrate comprises said second polarity type.

4. The method of claim 1, wherein said first polarity type is an n-type and said second polarity type is a p-type.

5. The method of claim 1, wherein said first polarity type is a p-type and said second polarity type is an n-type.

6. The method of claim 1, wherein step b) further comprises the step of:
    rotating said angle to form said first well.

7. The method of claim 1, further comprising the step of:
    implanting said first well at an angle within a range of 30 to 60 degrees from normal to the substrate.

8. The method of claim 1, wherein step c) further comprises the step of:
    implanting said first well at a energy level greater than an energy level of said implanting of said second well.

9. The method of claim 1, wherein step b) and step c) are done simultaneously.

10. The method of claim 6, wherein said implant of said first well is performed at an energy of 20 to 200 Kev and at a dosage of approximately 2E13.

11. A method of forming a MOSFET in a CMOS process comprising the steps of:
    a) disposing a layer of resist over at least a portion of a surface of a substrate;
    b) implanting at an angle into the substrate through a gap in said layer of resist an impurity of a first polarity type, said implanting and said angle sufficient to form a first well of said impurity of the first polarity type extending beneath said layer of resist;
    c) implanting an impurity of a second polarity type, using the same mask as used in the step of implanting at an angle, to form a second well of said impurity of the second polarity type disposed entirely within said first well; and
    d) forming the MOSFET entirely within said second well.

12. The method of claim 11, wherein said substrate comprises said second polarity type.

13. The method of claim 11, wherein said first polarity type is an n-type and said second polarity type is a p-type.

14. The method of claim 11, wherein said first polarity type is a p-type and said second polarity type is an n-type.

15. The method of claim 11, wherein step b) further comprises the step of:
    rotating said angle to form said first well.

16. The method of claim 11, further comprising the step of:
    implanting said first well at an angle within a range of 30 to 60 degrees from normal to the substrate.

17. The method of claim 11, wherein step c) further comprises the step of:
    implanting said first well at a energy level greater than an energy level of said implanting of said second well.

18. The method of claim 11, wherein step b) and step c) are done simultaneously.

19. The method of claim 17, wherein said implant of said first well is performed at an energy of 20 to 200 Kev and at a dosage of approximately 2E13.

* * * * *